(12) United States Patent
Fukasawa

(10) Patent No.: US 6,486,686 B1
(45) Date of Patent: Nov. 26, 2002

(54) APPARATUS FOR TESTING A BARE-CHIP LSI MOUNTING ON A PRINTED BOARD

(75) Inventor: Yoshihito Fukasawa, Tokyo (JP)

(73) Assignee: NEC Corporation, Tokyo (JP)

( * ) Notice: Subject to any disclaimer, the term of this patent is extended or adjusted under 35 U.S.C. 154(b) by 33 days.

(21) Appl. No.: 09/695,871

(22) Filed: Oct. 26, 2000

(30) Foreign Application Priority Data

Oct. 29, 1999 (JP) ............................................ 11-309012

(51) Int. Cl.⁷ ............................................... G01R 31/02
(52) U.S. Cl. ...................... 324/754; 324/762; 324/765
(58) Field of Search .............................. 324/754, 761, 324/762, 72.5; 439/482, 824

(56) References Cited

U.S. PATENT DOCUMENTS

| | | | |
|---|---|---|---|
| 4,417,204 A | * 11/1983 | Dehmel et al. | 324/537 |
| 5,157,325 A | * 10/1992 | Murphy | 324/72.5 |
| 6,130,547 A | * 10/2000 | Kato | 324/761 |
| 6,150,825 A | * 11/2000 | Prokopp et al. | 324/754 |

FOREIGN PATENT DOCUMENTS

| | | |
|---|---|---|
| JP | 64-7534 | 1/1989 |
| JP | 9-89991 | 4/1997 |
| JP | 2725615 | 12/1997 |
| JP | 10-132855 | 5/1998 |
| JP | 2833537 | 10/1998 |

* cited by examiner

*Primary Examiner*—Vinh P. Nguyen
(74) *Attorney, Agent, or Firm*—Sughrue Mion, PLLC

(57) ABSTRACT

In a bare-chip LSI mounting board test apparatus, at the stage that a bare-chip LSI is mounted on a board, tester boards on which equivalent parts corresponding to SMT parts other than the bare-chip LSI to be mounted on the board is confronted to the board, probes connected to the respective equivalent parts of the tester boards which correspond to the mount parts are brought into contact with pads located at the mount places of the mount parts on the board on which the bare-chip LSI is mounted to built a quasi-mount state of the mount parts to the board, and under this state a test signal is transmitted from a controller to the bare-chip LSI.

14 Claims, 5 Drawing Sheets

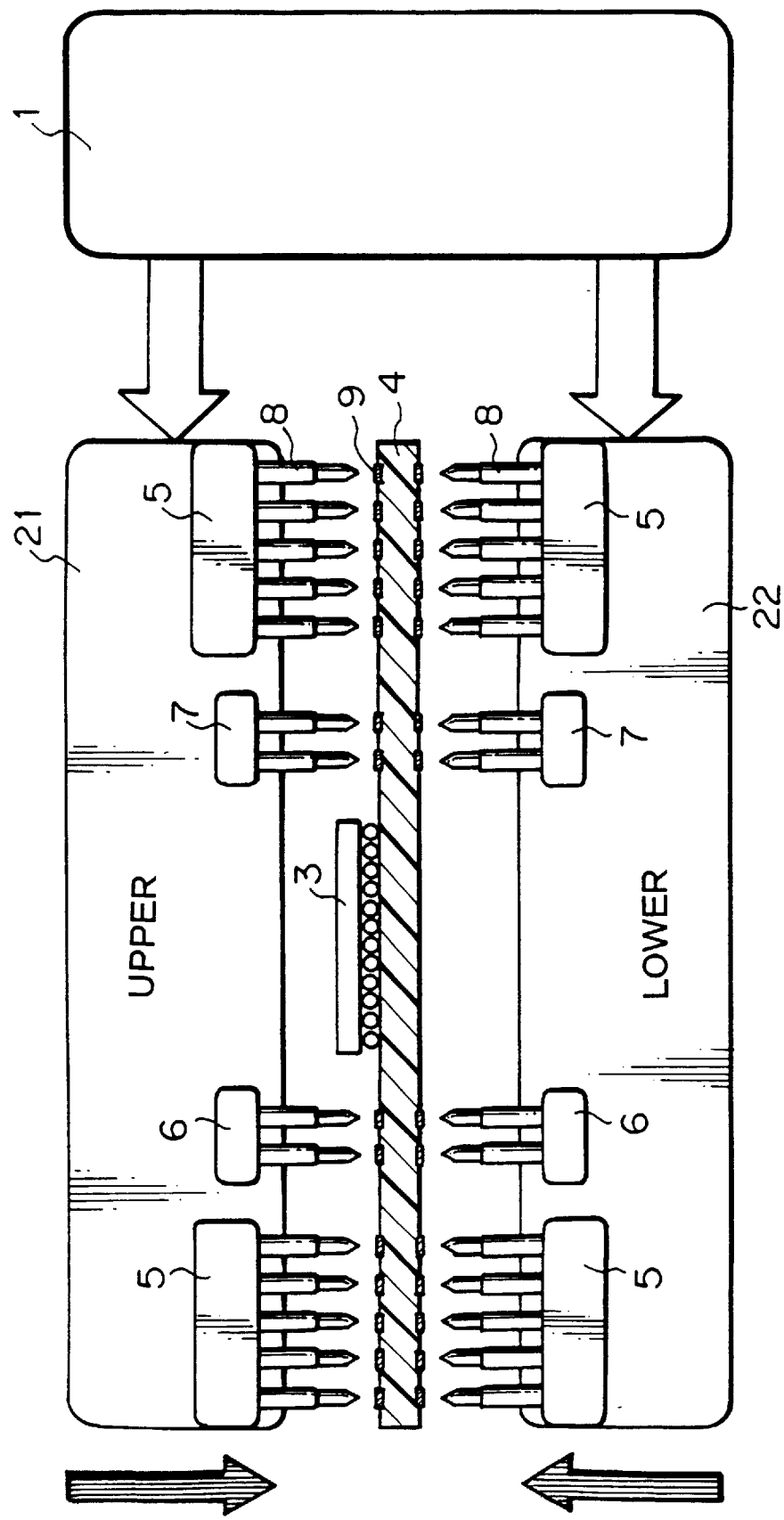

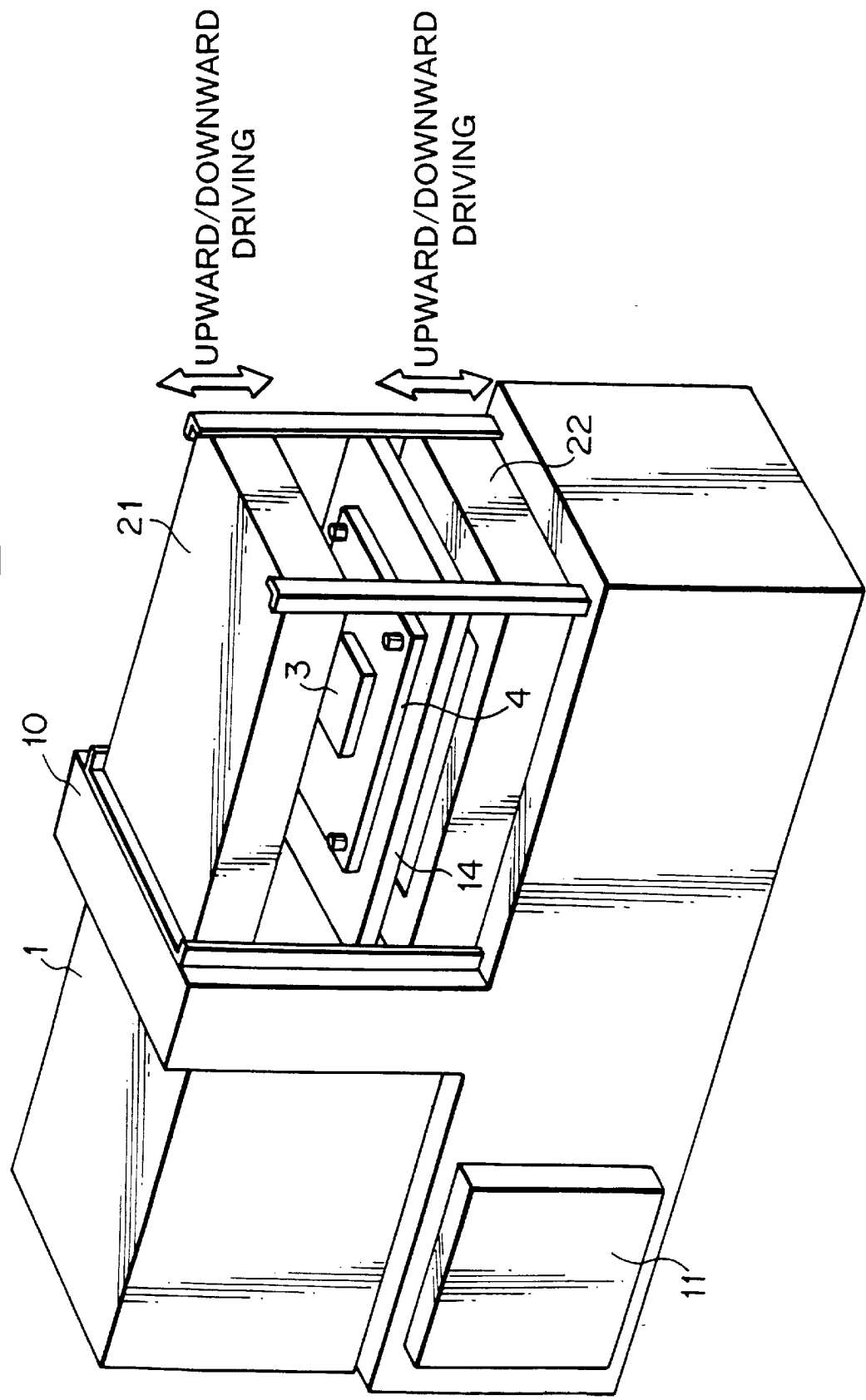

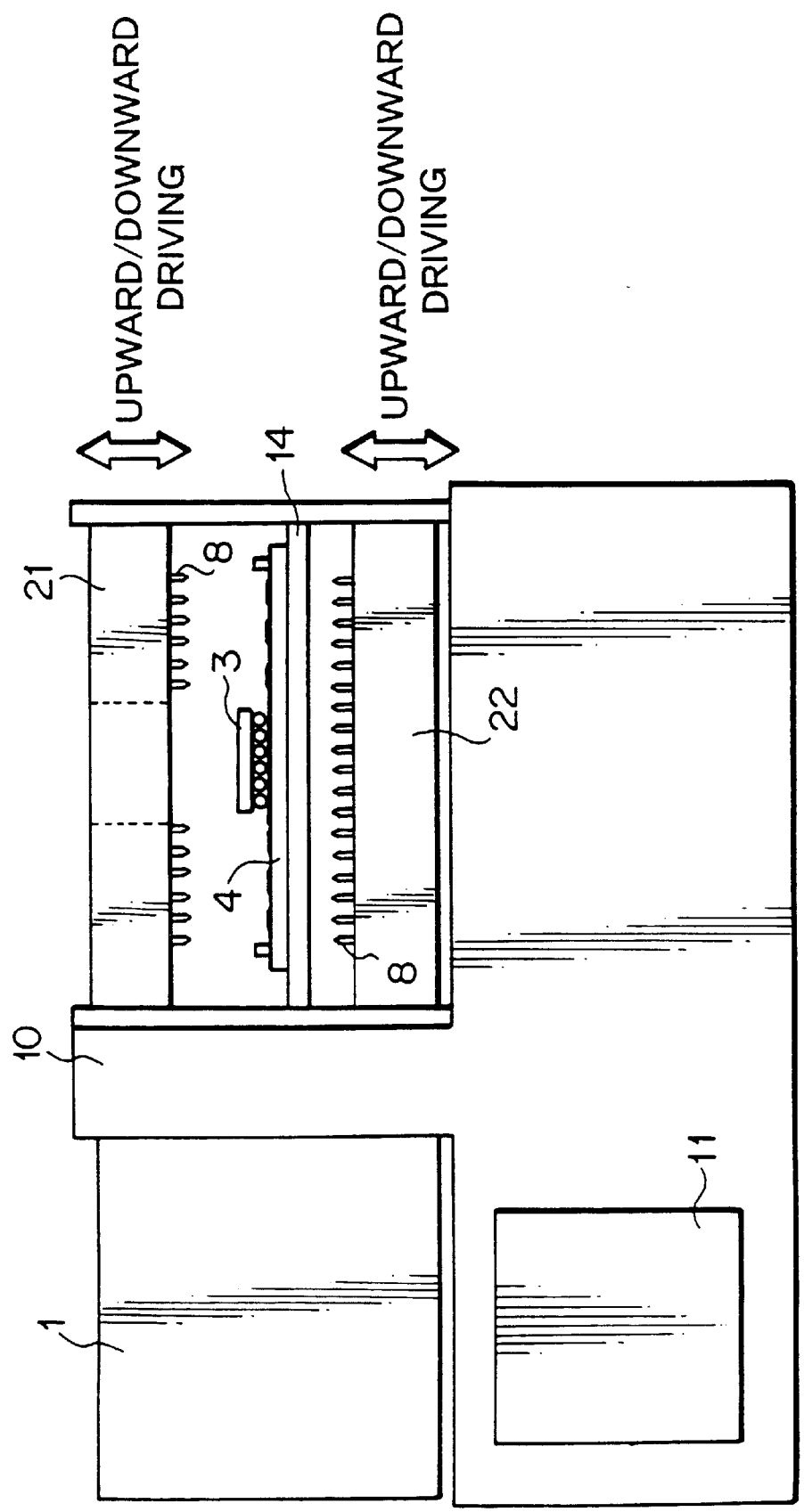

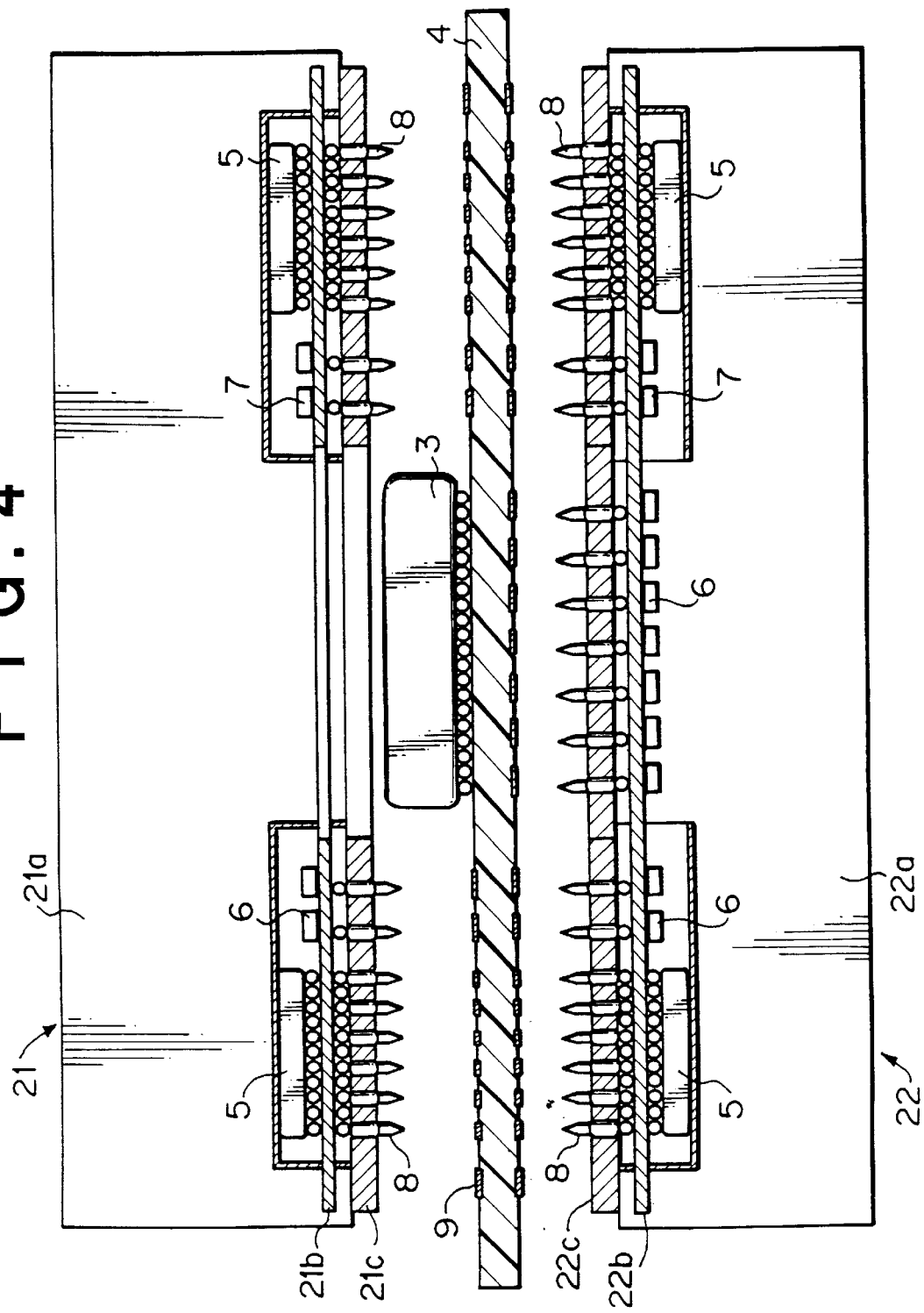

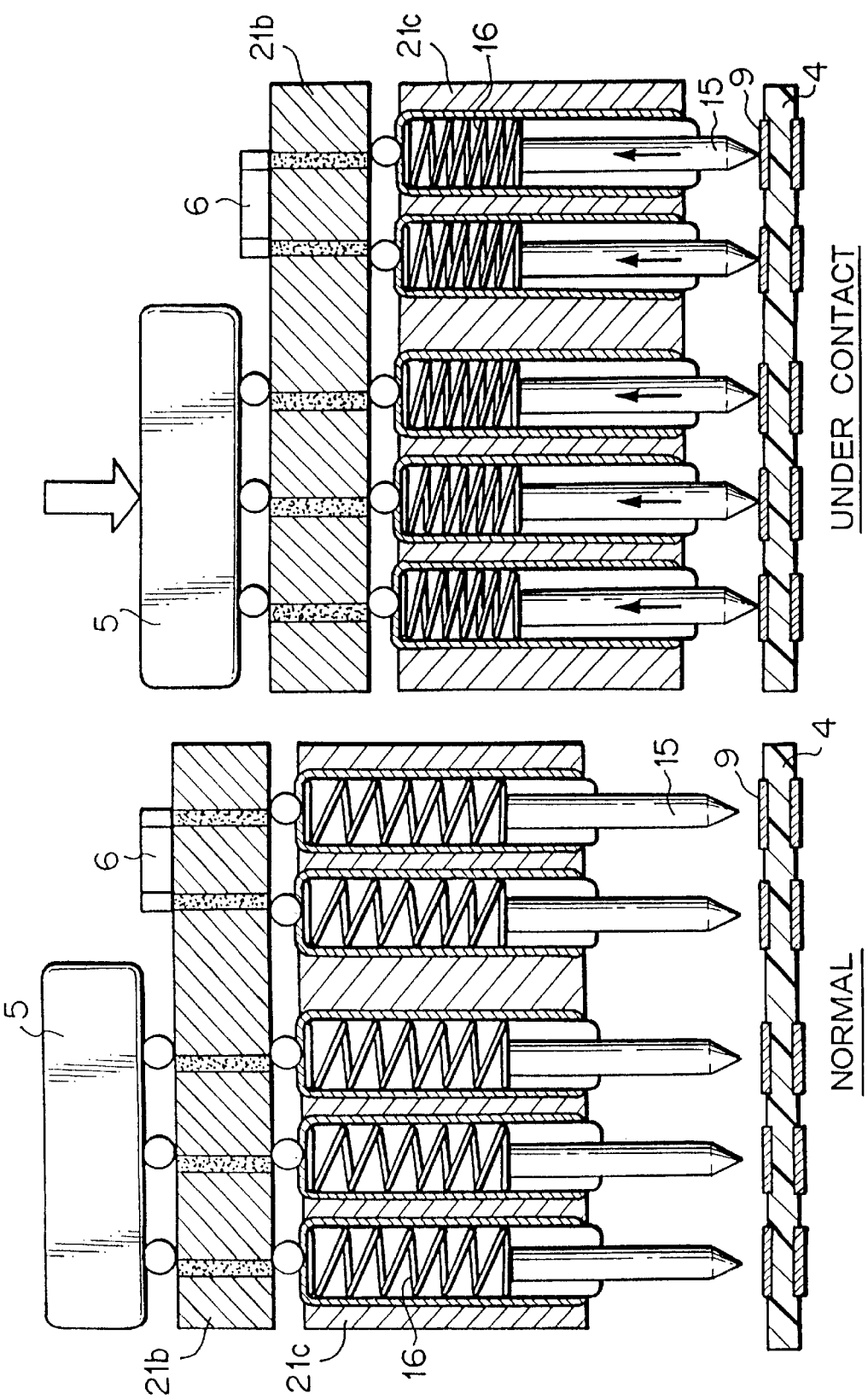

APPARATUS FOR TESTING A BARE-CHIP LSI MOUNTING ON A PRINTED BOARD

BACKGROUND OF THE INVENTION

1. Field of the Invention

The present invention relates to an apparatus for performing functional tests on LSI mounted on a board and particularly, to a test apparatus for a bare-chip LSI mounting board to perform a high-speed test in a short time.

2. Description of the Related Art

It has been hitherto difficult to perform a functional test at an actual speed on a bare-chip LSI alone. Therefore, it has been generally adopted to perform the functional test after a bare-chip LSI is mounted on a board and also SMT (surface mount technology) parts such as RAM, capacitors and resistors are mounted on the board. However, in this case, a conduction failure of the bare-chip LSI to the board, functional defects of the bare-chip LSI itself, or the like are found at the final stage of the manufacturing process, and thus the loss in productivity is increased. That is, even when the test failure is caused by the defect of the bare-chip LSI itself, a print board and other SMT parts which have been already mounted must be wasted.

SUMMARY OF THE INVENTION

The present invention has an object to provide a bare-chip LSI mounting board testing apparatus which can find a conduction failure, functional defects, or the like at such an early stage that a bare-chip LSI is mounted on a board before SMT parts such as RAM, capacitors and resistors are mounted, thereby reducing the loss in productivity.

Therefore, according to the present invention, a bare-chip LSI mounting board test apparatus comprising: at least one tester board which equivalent parts corresponding to mount parts other than a bare-chip LSI to be mounted on a board are mounted, probes connected to the respective equivalent parts of the tester boards, driving means for bringing the probes into contact with pads located at the mount places of the mount parts on the board to build a quasi-mount state of the mount parts to the board, and a controller for transmitting a test signal to the bare-chip LSI under the quasi-mount state. SMT parts having no leads. SMT parts having no leads and parts such as RAM, capacitors and resistors having leads, or parts such as RAM, capacitors and resistors having leads can be used as the mount parts.

In this case, as a preferable embodiment of the present invention, the tester boards have the respective equivalent parts mounted thereon in the same arrangement as the SMT parts, and the pair of tester boards are arranged so that the probes are arranged so as to be brought into contact with and detached from the respective pads on both surfaces of the board. Further, the controller of the high-speed tester transmits the test signal through the tester boards to the bare-chip LSI of the board.

BRIEF DESCRIPTION OF THE DRAWINGS

FIG. 1 is a diagram showing a first embodiment of the present invention;

FIG. 2 is a diagram showing the overall construction of a test apparatus of the embodiment of the present invention;

FIG. 3 is a cross-sectional view of the test apparatus;

FIG. 4 is a cross-sectional view showing the construction of a tester board and a connection method between the tester board and a print board; and FIGS. 5A–5B is a cross-sectional view showing the state of a probe contact portion of the tester board before contact and after contact.

DETAILED DESCRIPTION OF THE PREFERRED EMBODIMENT

A preferred embodiment according to the present invention will be described with reference to the accompanying drawings.

FIG. 1 is a diagram showing a first embodiment of the present invention.

In FIG. 1, controller 1 of a test apparatus transmits a test signal to 10 fixture portions 21 and 22. Fixture portions 21 and 22 are arranged so as to sandwich print board 4 (a board on which an examination is carried out) having bare-chip LSI 3 mounted thereon therebetween from upper and lower sides of the bare-chip LSI 3.

At the stage that the bare-chip LSI 3 is mounted on the print board 4, equivalent parts 5 to 7 corresponding to SMT parts such as RAM, capacitors and resistors to be mounted on the print board 4 are provided in the fixture portions 21 and 22, and the fixture portions 21 and 22 are arranged so as to face the print board 4. The equivalent parts 5 to 7 are RAM, capacitors and resistors respectively. Fine probe (for example, probe pins) 8 connected to the respective equivalent parts which correspond to the SMT parts to be mounted on the print board 4 are brought into contact with pads 9 located at places where the SMT parts will be mounted on the print board 4 to thereby build a quasi-mount state of the SMT parts, and under this state a test signal is transmitted from the controller 1 of the tester apparatus to the bare-chip LSI 3 to perform a high-speed test.

In this case, according to this embodiment, each fixture portion has the respective equivalent parts 3 to 7 mounted thereon in the same arrangement as the SMT parts. Particularly, the fixture portions 21 and 22 are arranged so as to sandwich the respective pads 9 formed on both the surfaces of the print board 4 therebetween from the upper and lower sides and so that the probes 8 can be brought into contact with and detached from the pads 9. By operating these probes 8 at a high frequency, the controller 1 transmits the test signal through the fixture portions 21 and 22 to the bare-chip LSI 3 of the print board 4.

As described above, before the SMT parts such as RAM, capacitors and resistors are mounted on the print board 4, a functional test at an actual speed can be performed on LSI alone at the stage that only the LSI is mounted on the print board 4. Therefore, defective products can be found at an early stage, so that the yield can be increased and the production cost can be lowered.

FIG. 2 is a diagram showing the overall construction of the test apparatus of this embodiment of the present invention, and FIG. 3 is a cross-sectional view of the test apparatus. FIG. 4 is a cross-sectional view showing the construction of the tester board and a connection method of connecting the tester board and the print board, and FIG. 5 is a cross-sectional view showing the state of the probe contact portion of the tester board after contact and before contact.

As shown in FIGS. 2 and 3, the print board 4 on which the bare-chip LSI 3 is mounted is fixed to a print board-fixing table 14. The print board-fixing table 14 is opened so that the pads of the print board 4 are exposed. The fixture portions 21 and 22 are arranged from the upper and lower sides of the print board-fixing table 14 so as to face the print board-fixing table 14 to which the print board 4 is fixed, and the two fixture portions 21 and 22 are driven by fixture driving portion 10 so as to be movable in the up-and-down direction.

As shown in FIGS. 4 and 5, the fixture portion 21 comprises tester board 21b, probe holding plate 21c and housing portion 21a to which the tester board 21b and the probe holding plate 21c are secured. Likewise, the fixture portion 22 comprises tester board 22b, probe holding plate 22c and housing portion 22a to which the tester board 22b and the probe holding plate 22c are secured.

The tester boards 21b, 22b and the probe holding plates 21c, 22c are secured to the confronting side to the print board 4 in fixture portions 21, 22. Since the print board-fixing table 14 is opened as described above, the tester boards 21b, 22b and the probe holding plates 21c, 22c can be arranged so as to face the print board 4 from the upper and lower sides thereof as described above. On each surface of the tester board 21b, 22b (the opposite surface to the confronting side to the print board 4) is mounted equivalent parts such as RAM 5, capacitors 6 and resistors 7 corresponding to RAM, capacitors and resistors which will be mounted on the print board 4. On the other surface of the tester board 21b, 22b (the surface confronting to the print board 4) is mounted probe pins 8 for connecting to the pads 9 of the print board 4. The probe pins 8 and the equivalent parts are electrically connected to one another through through-holes of the tester boards 21b, 22b by soldering or the like. The probe holding plates 21c, 22c hold the probes 8.

As shown in FIG. 5, each of the probe pins 8 has coil spring 16 and probe terminal 15 which is pressed by the coil spring 16, and the fixture portions 21 and 22 arranged at the upper and lower sides of the print board 4 are moved downwardly or upwardly, whereby these probe terminals 15 abut against the pads 9 of the print board 4. When the probe terminals 15 abut against the pads 9 of the print board 4 and are further pressed, the probe terminals 15 are retracted into the probe pins and are pressed against the pads 9 under fixed pressure by the coil spring 16. As described above, the equivalent parts such as the RAM 5, the capacitors 6, the resistors 7 and the print board 4 are electrically connected to one another, and the bare-chip LSI and the mount parts such as the RAM 5, the capacitors 6 and the resistors 7 are arranged as if they are actually boarded on the print board 4.

Further, under the state that the equivalent parts such as the RAM 5, the capacitor 6, the resistor 7 and the print board 4 are electrically connected to one another, the test signal is transmitted from the controller 1 to the print board 4 to perform the high-speed test, thereby examining the bare-chip LSI 3 as to whether the bare-chip LSI 3 can operate normally.

After the examination, the fixture portions 21 and 22 are moved in the up-and-down direction of the print board 4, and the print board 4 is detached from the print board-fixing table 14. If the bare-chip LSI 3 operates normally, the SMT parts such as RAM, capacitors and resistors are actually mounted on the print board 4. If the bare-chip LSI 3 does not operate normally, the print board 4 having the bare-chip LSI 3 concerned is wasted, or it is exchanged by another one, and the test is carried out again.

Power source portion 11 serves as a power source for the controller 1, and also serves as a driving power for the fixture driving portion 10.

In the above embodiment, two tester boards are confronted on both surfaces of the print board. In the case of one surface mounting board, one tester board may be confronted on the one surface of the print board.

As described above, according to the present invention, at the stage that the bare-chip LSI is mounted on the print board, the tester boards on which the equivalent parts corresponding to the SMT parts such as RAM, capacitors and resistors to be mounted on the print board are confronted to the print board from the upper and lower sides of the print board, and the probes of the respective equivalent parts of the tester boards corresponding to the SMT parts are brought into contact with the pads located at the SMT part mount places on the print board to construct the SMT part quasi-mount state for the print board. Under this state, the test signal is transmitted from the controller of the high-speed tester to the bare-chip LSI to perform the high-speed test.

Accordingly, the following effects can be achieved:

A first effect resides in that the functional test at the actual speed of the bare-chip LSI alone can be performed under the state that only the bare-chip LSI is secured to the print board. This is because the SMT parts to be originally mounted on the print board under test are mounted at the fixture portion side of the high-speed tester and the probes which can operate at a high frequency and very short time are brought into contact with the print board to perform the same high-speed operation as the actual operation of the apparatus.

A second effect resides in that the functional defects can be found at an early stage and thus the loss of repair can be reduced. This is because the functional defects which have been hitherto found by the examination of the apparatus at the final stage can be found at an early stage of the board manufacturing process with the same high-speed operation test as the actual apparatus, so that the failure cost of defective boards can be reduced.

What is claimed is:

1. A bare-chip LSI mounting board test apparatus comprising:
    at least one tester board comprising equivalent parts corresponding to mount parts other than a bare-chip LSI to be mounted on a board at mount places,
    probes connected to the respective equivalent parts of said tester boards,
    driving means for bringing said probes into contact with pads located at the mount places of said mount parts on said board to build a quasi-mount state of said mount parts to said board, and
    a controller for transmitting a test signal to said bare-chip LSI under the quasi-mount state.

2. The bare-chip LSI mounting board test apparatus as claimed in claim 1, wherein said tester board is equipped with said equivalent parts mounted thereon in the same arrangement as said mount parts.

3. The bare-chip LSI mounting board test apparatus as claimed in claim 1, wherein said controller transmits the test signal through said tester board to the bare-chip LSI of said board.

4. The bare-chip LSI mounting board test apparatus as claimed in claim 1, wherein said tester board is equipped with said equivalent parts mounted thereon in the same arrangement as said mount parts and said controller transmits the test signal through said tester board to the bare-chip LSI of said board.

5. An apparatus for testing a bare-chip LSI mounted to a printed board, said apparatus comprising:
    at least one fixture portion;
    at least one equivalent part attached to said at least one fixture portion, said at least one equivalent part corresponding to at least one mounted part to be fixed to at least one pad on said printed board;

at least one probe pin attached to said at least one fixture portion, said at least one probe pin for electrically connecting said at least one equivalent part to said at least one pad;

a driving portion for moving said at least one fixture portion so that said at least one probe pin contacts said at least one pad on said printed board, and a controller for transmitting a test signal to said printed board, said bare-chip LSI, and said at least one equivalent part, wherein said at least one equivalent part, said bare-chip LSI, and said printed board are electrically connected.

6. The apparatus for testing a bare-chip LSI mounted to a printed board according to claim 5, wherein said at least one probe pin is disposed to contact said print board in the same arrangement as said at least one mount part.

7. The apparatus for testing a bare-chip LSI mounted to a printed board according to claim 5, wherein said at least one equivalent part is a RAM, capacitor, or resistor.

8. The apparatus for testing a bare-chip LSI mounted to a printed board according to claim 5, wherein said at least one mounted part is a surface mounted part.

9. The apparatus for testing a bare-chip LSI mounted to a printed board according to claim 8, wherein said surface mounted part is a RAM, capacitor, or resistor.

10. The apparatus for testing a bare-chip LSI mounted to a printed board according to claim 1, wherein said apparatus is operable to allow said bare-chip LSI to be tested under a condition equivalent to a condition where said at least one mounted part is mounted to said printed board.

11. A bare-chip LSI mounting board test apparatus comprising:

at least one tester board comprising equivalent parts corresponding to mount parts other than a bare-chip LSI to be mounted on a board at mount places, probes connected to the respective equivalent parts of said tester boards, a driving portion for bringing said probes into contact with pads located at the mount places of said mount parts on said board to build a quasi-mount state of said mount parts to said board, and a controller for transmitting a test signal to said bare-chip LSI under the quasi-mount state.

12. The bare-chip LSI mounting board test apparatus as claimed in claim 11, wherein said tester board is equipped with said equivalent parts mounted thereon in the same arrangement as said mount parts.

13. The bare-chip LSI mounting board test apparatus as claimed in claim 11, wherein said controller transmits the test signal through said tester board to the bare-chip LSI of said board.

14. The bare-chip LSI mounting board test apparatus as claimed in claim 11, wherein said tester board is equipped with said equivalent parts mounted thereon in the same arrangement as said mount parts and said controller transmits the test signal through said tester board to the bare-chip LSI of said board.

* * * * *